US006614049B1

(12) United States Patent
Koyama

(10) Patent No.: US 6,614,049 B1
(45) Date of Patent: Sep. 2, 2003

(54) SYSTEM LSI CHIP HAVING A LOGIC PART AND A MEMORY PART

(75) Inventor: Tohru Koyama, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/543,545

(22) Filed: Apr. 5, 2000

(30) Foreign Application Priority Data

Apr. 9, 1999 (JP) .......................................... P11-102180

(51) Int. Cl.[7] ........................... H01L 23/58; H01L 23/48
(52) U.S. Cl. .......................... 257/48; 257/758; 257/776
(58) Field of Search ................................. 257/207, 208, 257/211, 296, 758, 776, 48; 438/118, 128, 129, 238, 239, 622, 11, 14, 15, 18

(56) References Cited

U.S. PATENT DOCUMENTS 5,608,241 A * 3/1997 Shibuya et al. ............. 257/207

6,261,883 B1 * 7/2001 Koubuchi et al. .......... 438/197

FOREIGN PATENT DOCUMENTS

| JP | 4-290242 | 10/1992 |
| JP | 5-144917 | 6/1993 |
| JP | 6-77299 | * 3/1994 |
| JP | 10-189679 | 7/1998 |

* cited by examiner

Primary Examiner—Steven Loke
Assistant Examiner—Hung Kim Vu
(74) Attorney, Agent, or Firm—Oblon, Spivak, McClelland, Maier & Neustadt, P.C.

(57) ABSTRACT

A dummy pattern layer, which has not been effectively used, included in upper wire layers of a memory part of a system LSI chip is utilized as a large-scale wire TEG (test element group) region while leaving a dummy pattern function. Thus, the system LSI chip is provided with the wire TEG region independent of a product region while keeping the product region.

4 Claims, 10 Drawing Sheets

SYSTEM LSI CHIP HAVING A LOGIC PART AND A MEMORY PART

BACKGROUND OF THE INVENTION

1. Field of the Invention

The present invention relates to a system LSI chip having a test structure (test element group: hereinafter abbreviated as TEG) for wires.

2. Description of the Background Art

In a semiconductor device such as an LSI, fining down and layer multiplication of wires progress following fining down and high integration of elements. A wire structure including an interlayer isolation film and a process of manufacturing the same are complicated due to such fining down and layer multiplication of the wires, and it is not too much to say that workmanship of the wires influences the performance and the yield of a product. The workmanship of the wires must be correctly and quickly evaluated for improvement of the yield and process control. Workmanship evaluation of the wires includes various types. For example, there is an evaluation immediately after manufacturing steps for checking whether or not abnormality such as disconnection or shorting is caused by a random factor such as a failure or contamination, whether or not the wires have been formed in a designed width and the like. Another example of evaluation is reliability assessment with an acceleration test for checking aging (occurrence of voids in the wires caused by migration etc.) of a completed chip.

While the workmanship of the wires in the product chip themselves must be evaluated independently of the remaining circuit elements included in the product chip, it is difficult and inefficient to perform such evaluation employing the product chip.

Therefore, the evaluation is generally made employing various TEGs formed with only wire structures. More specifically, the wires are evaluated by measuring a parameter such as the resistance value of such a wire TEG and detecting a portion having deficiency or abnormality by an optical method such as observation with an emission microscope or OBIC (optical beam induced current) analysis when the parameter is different from a designed value.

In general, a test wafer formed with only a wire TEG is manufactured independently of a product wafer, or a wire TEG region is provided on a region of a product wafer excluding a product chip region.

In the former case, however, the test wafer manufactured independently of the product wafer may not correctly reflect abnormality caused in the product wafer by a random factor. Statistical investigation is necessary for improving the detection rate of abnormality caused by a random factor. Consequently, the test wafer must be prepared frequently. However, the cost for the product is disadvantageously increased in this case.

In the latter case, the area occupied by the product chip is reduced due to the wire TEG region provided in the product wafer. Consequently, the yield of the product chip is reduced, to result in increase of the cost for the product. While the area of the wire TEG region may be reduced for avoiding increase of the cost, the detection rate for abnormality caused by a random factor is reduced if the area of the wire TEG region is reduced. Thus, sufficient investigation on the product cannot be expected in this case.

Thus, in the conventional mode of wire TEGs, the cost is inevitably increased in order to improve the detection rate for abnormality caused by a random factor in the product chip.

To this end, it is conceivable to build wire TEGs into the product chip itself. In other words, some free spaces present in the product chip may be utilized as wire TEG forming regions. Japanese Patent Application Laid-Open No. 5-144917 (1993) describes an example of such a technique. FIG. 9 is a plan view showing a chip CP2 for illustrating this technique. The chip CP2 includes free spaces 301 formed with substrate wire TEGs, a region 302 formed with internal cells and normal wires and regions 303 formed with I/O cells.

According to this technique forming the wire TEGs in the product chip, abnormality caused in the product chip by a random factor can be detected without manufacturing a number of test wafers. Further, the free spaces in the product chip are utilized, not to reduce the yield of the product chip. Thus, the workmanship of the wires can be evaluated while avoiding the problems arising in the conventional wire TEGs.

However, Japanese Patent Application Laid-Open No. 5-144917 disclosing this technique describes only that the wire TEGs are formed on the free spaces (four corners of the chip, for example) in the product chip with no consideration on variation of effects with positions for forming the wire TEGs. In the case of the chip CP2 shown in FIG. 9, the wire TEGs are formed in the regions different from the region 302 formed with the internal cells and normal wires and the I/O cell forming regions 303 in plan view. When thus avoiding the regions functioning as the product (hereinafter referred to as product regions) in plan view, however, there is such a possibility that only extremely small free spaces are left and the wire TEG regions cannot have sufficient areas.

A chip having a multilayer wire structure may have a wide free space in addition to a plane provided with a product region. In a system LSI chip integrating a memory part and a logic part, the logic part requires a multilayer wire structure having wires present over a number of layers, while about two upper wire layers necessary for power supply/ground wires may be present in the memory part in general. Therefore, a considerably wide free space, corresponding to the area of the memory part, is present on the upper wire layers of the memory part.

In the system LSI, however, metal films, referred to as dummy patterns, of about several $\mu$m square are generally spread over this free space. The dummy patterns are provided in order not to cause dishing (dish-shaped depressions) on the surface of an interlayer isolation film of the memory part when performing chemical mechanical polishing (hereinafter abbreviated as CMP) for forming wire films of the multi-layer wire structure of the logic part and to attain roughness balance of the metal films for preventing occurrence of etching rate difference between the logic part and the memory part due to small areas of the metal films in the memory part when forming patterns of the wire films of the logic part.

FIGS. 10 to 12 illustrate the structure of such a system LSI chip CP1. FIG. 10 is a plane layout diagram of a memory part MM and a logic part LG on the chip CP1, and FIG. 11 is a plan view showing a region RG on the memory part MM in an enlarged manner for illustrating the arrangement of dummy patterns DP formed in a free space on a memory array. Referring to FIG. 10, the memory part MM is designed in a scale substantially identical to that of the logic part LG. While such memory parts MM occupy system LSI chips in various area rates, the memory part MM generally occupies a somewhat large part in the total area of the system LSI chip CP1.

FIG. 12 is a sectional view taken along the line C—C in FIG. 11. As shown in FIG. 12, the memory part MM comprises an element layer 402 having a number of memory cells MC (sets of DRAMs and capacitors, for example) on a substrate 401, while a wire layer 403 having power supply/ground wires IL1 and IL2 and a dummy pattern layer 404 formed with a number of dummy patterns DP are provided thereon. The dummy patterns DP have surfaces flush with the surfaces of wires (not shown) of respective layers in a multilayer wire structure of the logic part LG. Referring to FIG. 12, the dummy pattern layer 404 includes three layers, for example. Interlayer isolation films IS0, IS1, IS2, IS3 and IS4 are formed between the memory cells MC and the power supply/ground wires IL1, between the power supply/ground wires IL1 and the power supply/ground wires IL2, between the power supply/ground wires IL2 and the dummy pattern layer 404 and between the respective layers of the dummy pattern layer 404 respectively for isolating these layers from each other. A passivation film PV protecting the surfaces is formed on the uppermost dummy patterns DP. FIG. 12 illustrates the layer formed with the wires IL1, located immediately on the element layer 402, as a first layer, the layer formed with the wires IL2 as a second layer, and the respective layers of the dummy pattern layer 404 as third, fourth and fifth layers in ascending order respectively.

Thus, the third to fifth layers of the memory part MM of the chip CP1, having allowance for forming a wire region in an extent substantially identical to the area of the memory part MM, are only employed as dummy patterns.

SUMMARY OF THE INVENTION

According to a first aspect of the present invention, a system LSI chip comprises a substrate having first and second regions on its surface, a multilayer wire structure formed on the first region of the substrate, an element layer, formed on the second region of the substrate, having a memory cell, an interlayer isolation film formed on the element layer, and a wire test structure formed on the interlayer isolation film over the whole area of the second region.

In the system LSI chip according to the first aspect of the present invention, the wire test structure is formed on the interlayer isolation film located on the second region, whereby abnormality caused in the system LSI chip by a random factor such as a failure or contamination can be detected and workmanship of the wire test structure can be evaluated independently of the remaining elements in the system LSI chip. Further, the wire test structure can be formed in a large scale over the whole area of the second region on the element layer through the interlayer isolation film, whereby the detection rate for abnormality caused in the system LSI chip by a random factor such as a failure or contamination is increased as compared with the case of forming the wire test structure on a small free space in the same plane as the second region. After evaluation of the workmanship, the wire test structure functions also as an electric shielding structure for the second region.

According to a second aspect of the present invention, the wire test structure is a series of wire structures having a number of via hole connection parts.

According to a third aspect of the present invention, the wire test structure has interdigital electrodes.

According to a fourth aspect of the present invention, the wire test structure comprises a single wire presenting a zigzag pattern.

According to a fifth aspect of the present invention, the multilayer wire structure and the wire test structure are formed through a common step.

In the system LSI chip according to the fifth aspect of the present invention, the wire test structure is formed through the step in common with the multilayer wire structure, whereby the wire test structure located on the second region is also subjected to CMP when forming the multilayer wire structure located on the first region by CMP so that dishing is hardly caused on the surface of the interlayer isolation film located on the second region while roughness balance of wire films can be ensured between the first region and the second region. In other words, the wire test structure functions also as a dummy pattern.

According to a sixth aspect of the present invention, a fixed potential is supplied to part of the wire test structure.

In the system LSI chip according to the sixth aspect, a single electrode pad can be omitted as to a single wire TEG pattern, whereby the number of electrode pads requiring a wide area can be reduced and electrode pads for a product region can be widely provided. Further, the wire test structure supplied with the fixed potential becomes a conductor film whose potential is fixed after completion of workmanship evaluation, to attain a more effective electric shielding function.

According to a seventh aspect of the present invention, the system LSI chip according to the fifth aspect further comprises an electrode pad, connected with the wire test structure, having a surface flush with a part of the wire test structure furthest from the substrate.

In the system LSI chip according to the seventh aspect, a portion of deficiency or abnormality can be detected with an optical method in a state having no upper wire layer serving as a screen for the wire test structure, whereby the abnormality can be readily detected.

According to an eighth aspect of the present invention, a method of manufacturing a system LSI chip comprises steps (a) to (e) of (a) preparing a substrate having first and second regions on its surface, (b) forming an element layer having memory cells on the second region, (c) forming a first interlayer isolation film on the first region and on the element layer, (d) forming a first conductor film on the first interlayer isolation film, and (e) patterning the first conductor film for forming a multilayer wire structure on the first interlayer isolation film located on the first region while forming a wire test structure extending over the whole area of the second region on the first interlayer isolation film located on the second region.

According to a ninth aspect of the present invention, the wire test structure is a series of wire test structures having a number of via hole connection parts.

According to a tenth aspect of the present invention, the wire test structure has interdigital electrodes.

According to an eleventh aspect of the present invention, the wire test structure comprises a single wire presenting a zigzag pattern.

According to a twelfth aspect of the present invention, the method of manufacturing a system LSI chip according to the eighth aspect further comprises, when forming the wire test structure and the multilayer wire structure to extend also along the thickness of the substrate, steps (f) to (i) of (f) further forming a second interlayer isolation film to cover the wire test structure and the multilayer wire structure, (g) patterning the second interlayer isolation film for forming a via hole exposing the wire test structure and the multilayer wire structure, (h) forming a second conductor film on the second interlayer isolation film subsequently to the step (g), and (i) patterning the second conductor film for forming the multilayer wire structure to extend above the second interlayer isolation film located on the first region and forming the wire test structure to extend above the second interlayer isolation film located on the second region.

According to a thirteenth aspect of the present invention, the wire test structure is a series of wire structures having a number of via hole connection parts.

According to a fourteenth aspect of the present invention, the wire test structure has interdigital electrodes.

According to a fifteenth aspect of the present invention, the wire test structure comprises a single wire presenting a zigzag pattern.

According to a sixteenth aspect of the present invention, the method of manufacturing a system LSI chip according to the twelfth aspect also forms an electrode pad connected to the wire test structure above the first or second interlayer isolation film when the step (e) or step (i) is a step of forming a part of the wire test structure furthest from the substrate.

In the method of manufacturing a system LSI chip according to the sixteenth aspect, the electrode pad connected to the wire test structure is also formed when forming the part of the wire test structure furthest from the substrate, whereby workmanship of the wire test structure can be evaluated immediately after forming the wire test structure for detecting abnormality and selecting a defective chip in an early stage of the process. Thus, it is possible to not perform a subsequent process on the defective chip having abnormality in its wire, in order to avoid waste. Further, a portion of deficiency or abnormality can be detected with an optical method in a state having no upper wire layer serving as a screen for the wire test structure, whereby the abnormality can be readily detected.

According to a seventeenth aspect of the present invention, the wire test structure is a series of wire structures having a number of via hole connection parts.

According to an eighteenth aspect of the present invention, the wire test structure has interdigital electrodes.

According to a nineteenth aspect of the present invention, the wire test structure comprises a single wire presenting a zigzag pattern.

An object of the present invention is to utilize a dummy pattern layer in a free space on memory cells of a memory part of a system LSI chip, which has not been effectively used, as a large-scale wire TEG region while leaving a dummy pattern function.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

A system LSI chip according to an embodiment 1 of the present invention comprises a series of wire structures having a number of via hole connection parts (hereinafter referred to as a via hole chain) on a dummy pattern layer of a memory part as an exemplary wire TEG.

Figure 1:
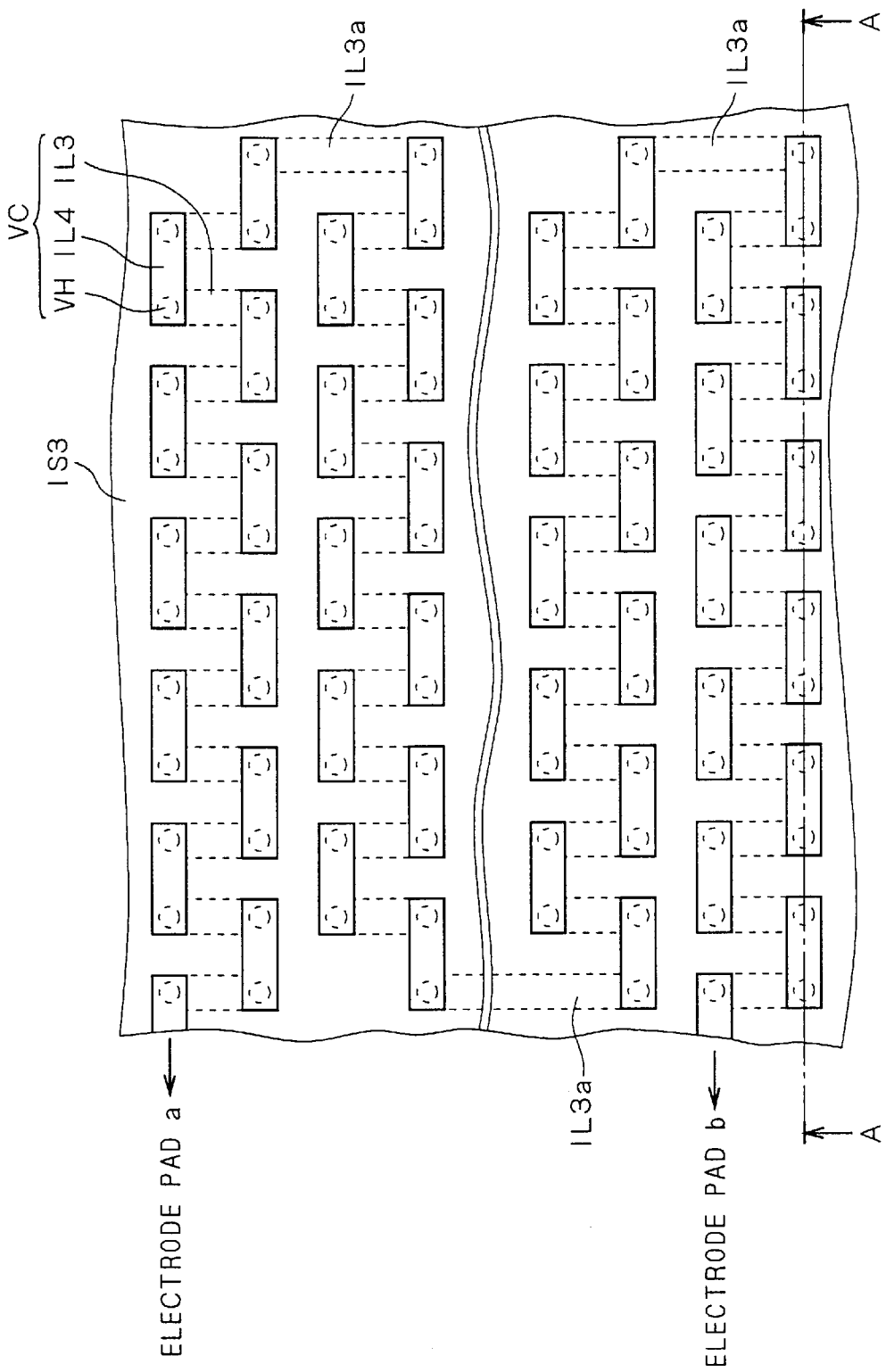
FIG. 1 illustrates part of a system LSI chip according to an embodiment 1 of the present invention.
Figure 10:
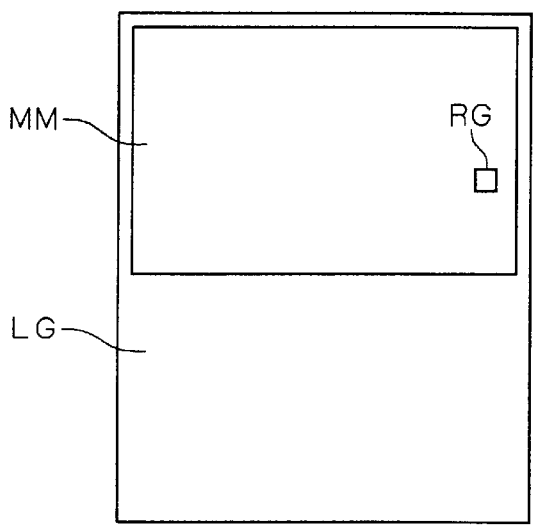
FIG. 10 illustrates a conventional system LSI chip.
Figure 11:
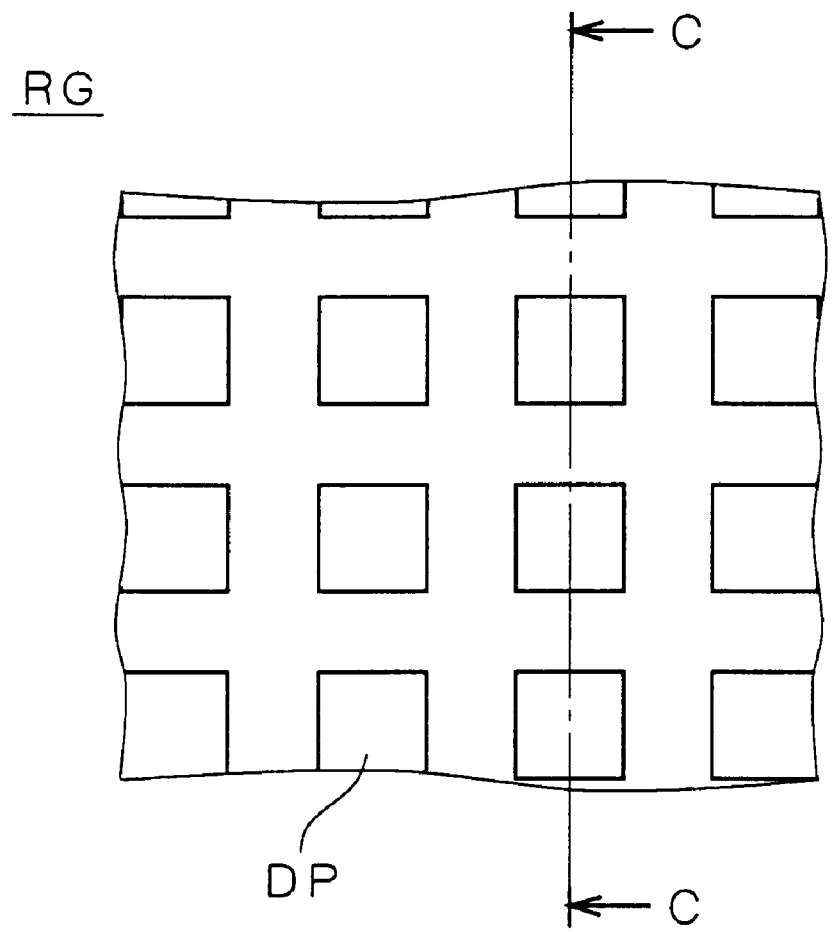
FIG. 11 illustrates part of the conventional LSI chip.

FIG. 1 is an enlarged view of the region RG in the case of forming a via hole chain VC as a wire TEG in the dummy pattern layer 404 of the memory part MM of the system LSI chip CP1 shown in FIG. 10 for illustrating exemplary arrangement of the via hole chain VC.

A plurality of upper layer wires IL4, a plurality of lower layer wires IL3 through an interlayer isolation film IS3 and a plurality of via hole connection parts VH connecting these wires are coupled with each other to form the via hole chain VC. Referring to FIG. 1, for example, the via hole chain VC is formed in a zigzag manner by repeating a set of the wire IL3, the via hole connection parts VH provided on both ends of each wire IL3 and the wire IL4. The wire IL4 has an end connected to the via hole connection part VH provided on one end of the wire IL3, and is arranged perpendicularly to the wire IL3. The wire IL4 of a certain set is connected with the via hole connection part VH of another set not connected to the wire IL4 of another set. The via hole chain VC is formed over the whole area of the memory part MM with some intermediate folded parts IL3a. Electrode pads a and b are connected to both ends of the via hole chain VC. Japanese Patent Application Laid-Open No. 4-290242 (1992), for example, describes an example similar to such a via hole chain. However, no literature discloses a via hole chain such as that in this embodiment provided in a free space on memory cells of a memory part.

Figure 2:
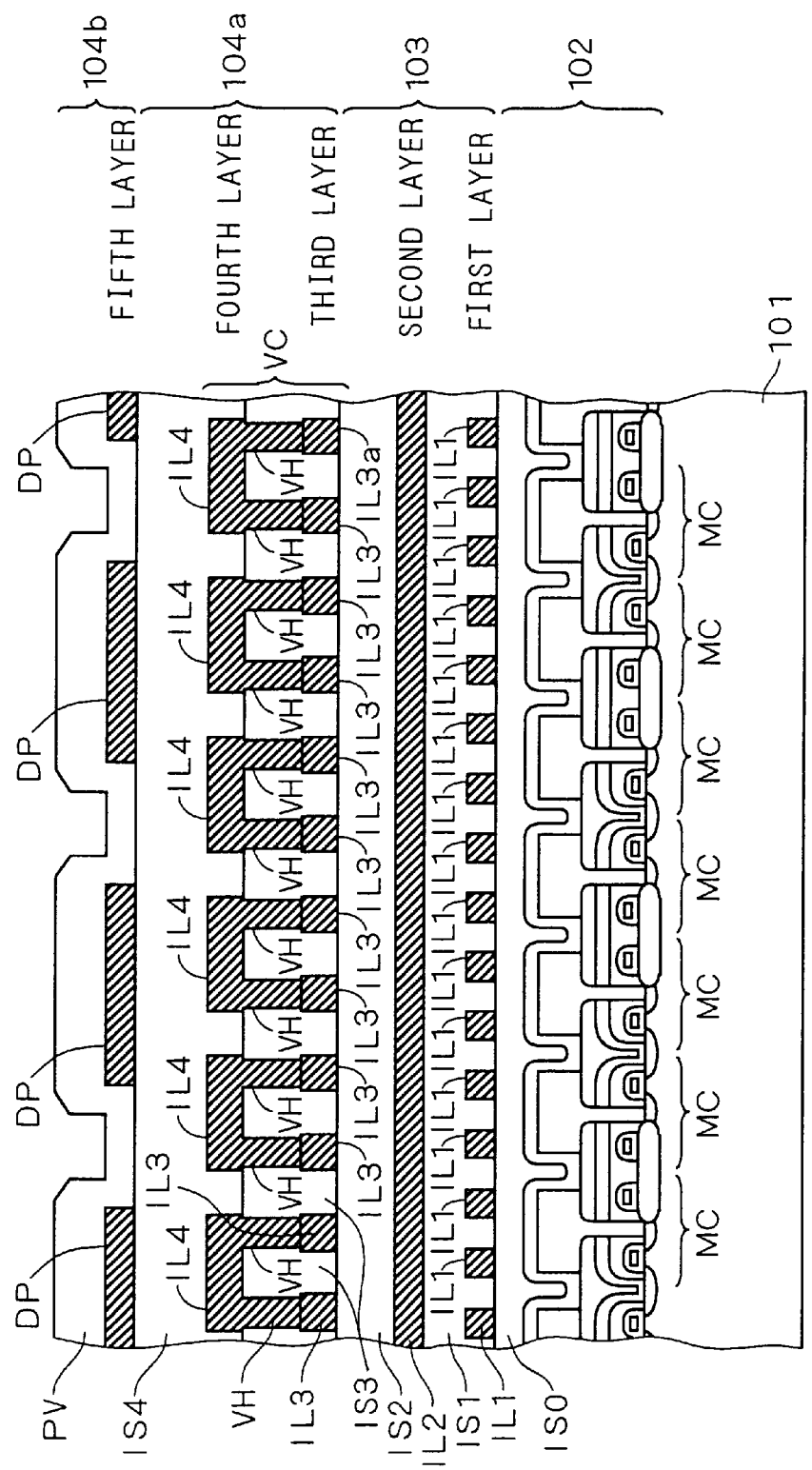
FIG. 2 is a sectional view of the system LSI chip according to the embodiment 1 of the present invention.

FIG. 2 is a sectional view taken along the line A—A in FIG. 1. The memory part MM provided with the via hole chain VC comprises an element layer 102 having a number of memory cells MC (sets of DRAMs and capacitors, for example) on a substrate 101. Further, the memory part MM comprises a wire layer 103 having power supply/ground wires IL1 and IL2, a TEG and dummy pattern layer 104a having the via hole chain VC formed by the wires IL3, IL4 and the via hole connection parts VH and a dummy pattern layer 104b having dummy patterns DP provided above the element layer 102, for example. Interlayer isolation films IS0, IS1, IS2, IS3 and IS4 are formed between the memory cells MC and the power supply/ground wires IL1, between the power supply/ground wires IL1 and the power supply/ground wires IL2, between the power supply/ground wires IL2 and the wires IL3, between the wires IL3 and the wires IL4 and between the wires IL4 and the dummy patterns DP respectively for isolating the layers from each other. A passivation film PV protecting the surfaces is formed on the uppermost dummy patterns DP. FIG. 2 illustrates the layer formed with the power supply/ground wires IL1 as a first layer, the layer formed with the power supply/ground wires IL2 as a second layer, the layer formed with the wires IL3 as a third layer, the layer formed with the wires IL4 as a fourth layer and the layer formed with the dummy patterns DP as a fifth layer. Electrode pads a and b are connected to both ends of the via hole chain VC. The electrode pads a and b (not shown) are formed on the uppermost layer (the fifth layer in FIG. 2) of the system LSI chip separately from electrode pads of a product region, for example.

Also in a logic part LG, wires and interlayer isolation films (not shown) are formed along with formation of the power supply/ground wires IL1 and IL2, the wires IL3 and IL4, the dummy patterns DP and the interlayer isolation films IS0 to IS4.

In the system LSI chip according to this embodiment, the TEG of the via hole chain VC is formed in the dummy pattern layer in the multilayer wire structure of the memory part MM, whereby abnormality caused in the product chip caused by a random factor such as a failure or contamination can be detected and the workmanship of the wires themselves can be evaluated independently of the remaining circuit elements in the product chip. In other words, a parameter such as the resistance value of the via hole chain VC is measured for determining whether or not the parameter deviates from a designed value so that the workmanship of the wires of the product chip can be evaluated by analyzing the portion of deficiency or abnormality with an emission microscope or the like when the parameter deviates beyond the allowable range. Further, the memory part MM occupies a somewhat large area in the system LSI chip and a large-scale wire TEG can be formed above the memory cells over the whole area of the memory part MM, whereby the detection rate for abnormality is higher as compared with the case of forming the wire TEG in a small free space flush with the product region. Further, the via hole chain VC is formed through the common step as the wires on the upper layer of the logic part LG, whereby the wires IL3 and IL4 are also subjected to CMP when performing CMP on the wires of the upper layer of the logic part LG so that dishing is hardly caused on the surfaces of the interlayer isolation films of the memory part MM and roughness balance of metal films can be ensured in pattern formation of wire metals. In other words, the wire TEG also functions as a dummy pattern. After completion of workmanship evaluation, the wire TEG of the via hole chain VC becomes an unenergized metal film, to function also as an electric shielding member preventing the memory part MM from electrical influence from the chip surface.

Embodiment 2

A system LSI chip according to an embodiment 2 of the present invention comprises not a wire TEG extending over two layers such as the via hole chain in the embodiment 1 but a shorting detection wire TEG for a single layer in a dummy pattern layer of a memory part.

Figure 3:
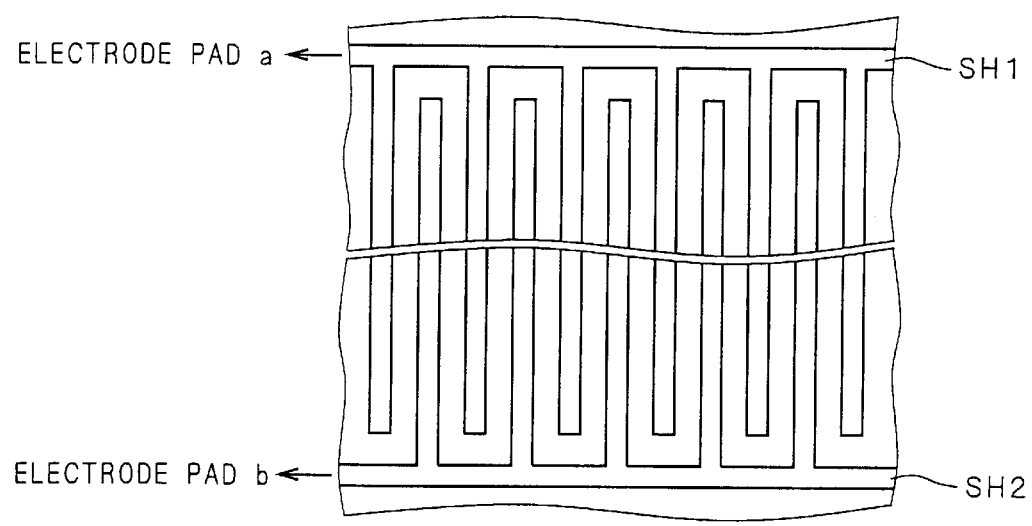
FIG. 3 illustrates part of a system LSI chip according to an embodiment 2 of the present invention.

FIG. 3 illustrates the region RG in the case of applying a TEG of shorting detection wire patterns SH1 and SH2 to the dummy pattern layer of the memory part MM of the system LSI chip CP1 shown in FIG. 10 in an enlarged manner. The shorting detection wire patterns SH1 and SH2, which are interdigital wire patterns, are so arranged that the teeth of the shorting detection wire pattern SH1 are located in the clearances between the teeth of the shorting detection wire pattern SH2 or vice versa not to come into contact with each other over the whole area of the memory part MM. In other words, the shorting detection wire patterns SH1 and SH2 are interdigital electrodes. Electrode pads a and b are provided on ends of the shorting detection wire patterns SH1 and SH2 respectively. Japanese Patent Application Laid-Open No. 5-144917 (1993), for example, describes a similar shorting detection wire pattern. However, no literature discloses such a shorting detection wire pattern as that in the embodiment 2 provided in a free space on memory cells of a memory part.

Figure 12:
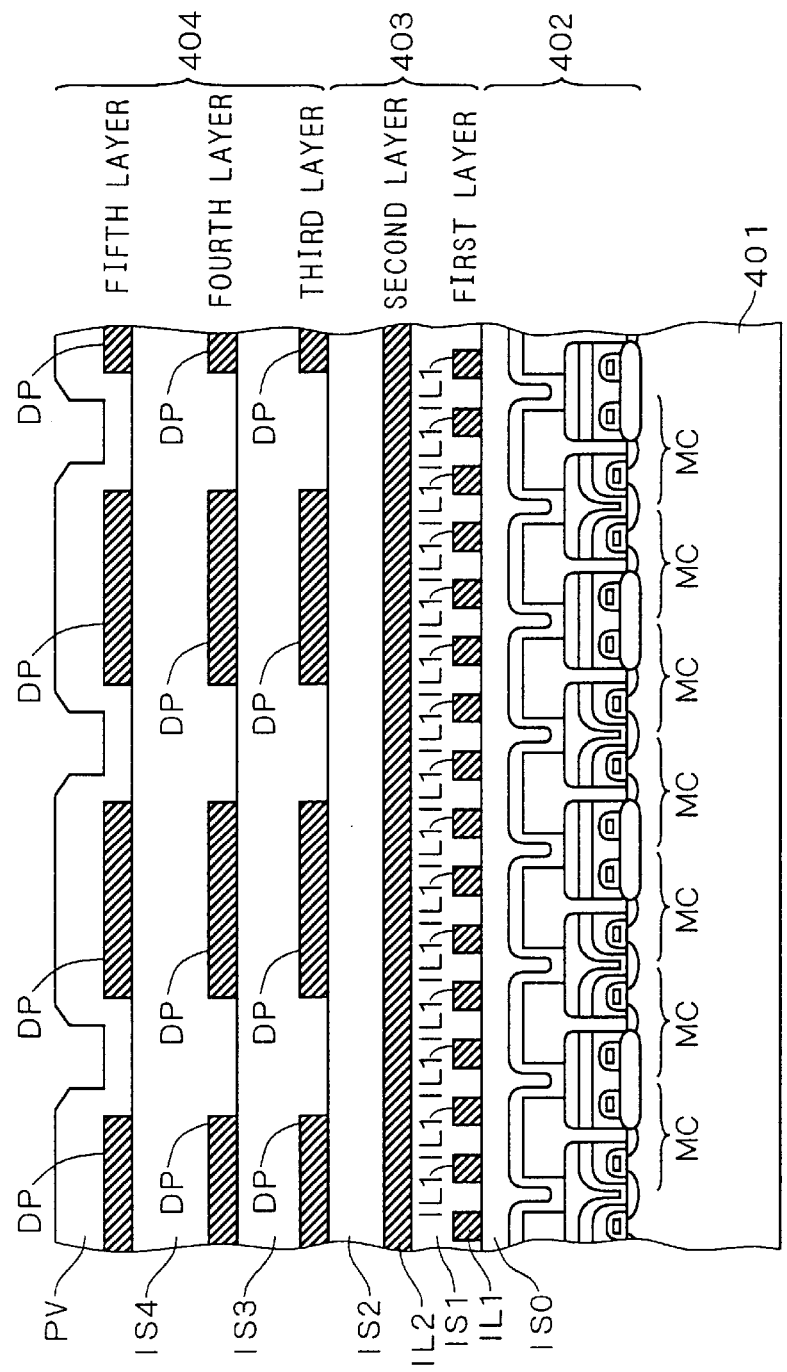
FIG. 12 is a sectional view of the conventional system LSI chip.

When the patterns SH1 and SH2 are formed in any of the layers composing the dummy pattern layer 404 shown in FIG. 12 in place of the dummy patterns DP and the electrode pads a and b are formed in the uppermost wire layer of the system LSI chip separately from electrode pads in the product region, for example, it follows that a large-scale wire TEG is built into the system LSI chip similarly to the embodiment 1.

In the system LSI chip according to this embodiment, the wire TEG of the shorting detection wire patterns SH1 and SH2 is formed in the dummy pattern layer in the multilayer wire structure of the memory part MM, whereby abnormality caused in the product chip by a random factor such as a failure or contamination can be detected. In other words, it is possible to determine whether or not wires are shorted by measuring the resistance value between the electrode pads a and b of the shorting detection wire patterns SH1 and SH2. If contaminated with foreign matter or the like, the foreign matter or the like shorts the shorting detection wire patterns SH1 and SH2 to reduce the resistance value between the electrode pads a and b. Further, a large-scale wire TEG can be formed above memory cells over the whole area of the memory part MM similarly to the system LSI chip according to the embodiment 1, whereby the detection rate for abnormality is higher as compared with the case of forming the wire TEG in a small free space flush with the product region. In addition, the wire TEG functions also as a dummy pattern and an electric shielding member.

Embodiment 3

A system LSI chip according to an embodiment 3 of the present invention comprises a disconnection detection wire TEG for a single layer in a dummy pattern layer of a memory part.

Figure 4:
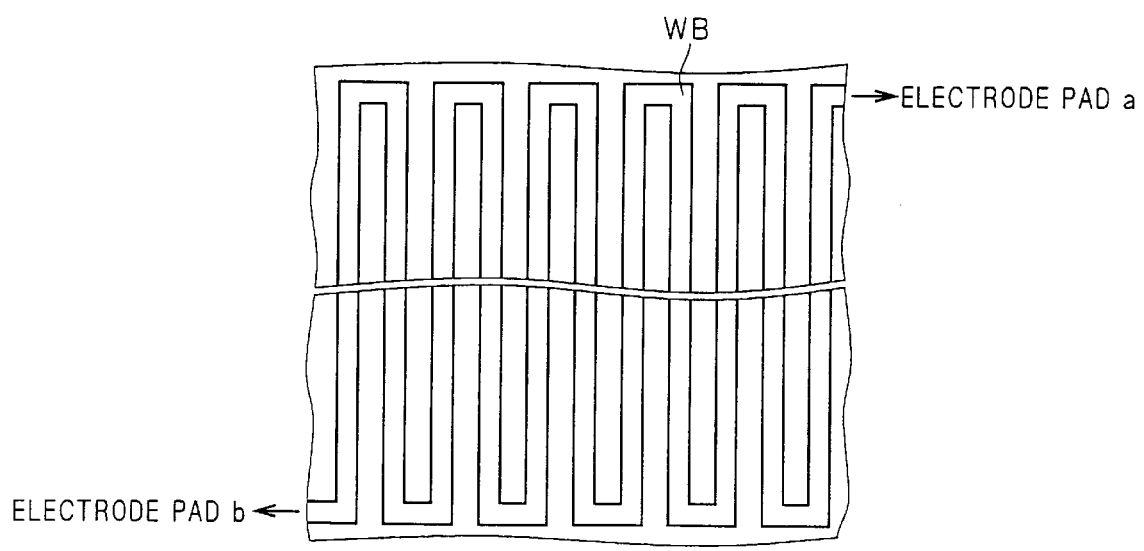
FIG. 4 illustrates part of a system LSI chip according to an embodiment 3 of the present invention.

FIG. 4 shows the region RG in the case of applying a TEG of a disconnection detection wire pattern WB to the dummy pattern layer in the memory part MM of the system LSI chip CP1 shown in FIG. 10 in an enlarged manner. The disconnection detection wire pattern WB, which is a wire having a zigzag pattern, is formed over the whole area of the memory part MM. Electrode pads a and b are connected to both ends thereof. Japanese Patent Application Laid-Open No. 10-189679 (1998), for example, describes a similar disconnection detection wire pattern. However, no literature discloses such a disconnection detection wire pattern as that of this embodiment provided in a free space on memory cells of a memory part.

When this pattern WB is formed in any of the layers composing the dummy pattern layer 404 shown in FIG. 12 in place of the dummy patterns DP and the electrode pads a and b are formed in the uppermost wire layer of the system LSI chip separately from electrode pads of the product region, for example, it follows that a large-scale wire TEG is built into the system LSI chip similarly to the embodiment 1 or 2.

In the system LSI chip according to this embodiment, the wire TEG of the disconnection detection wire pattern WB is formed in the dummy pattern layer in the multilayer wire structure of the memory part MM, whereby abnormality caused in the product chip by a random factor such as a failure or contamination can be detected. In other words, it is possible to determine whether or not wires are disconnected by measuring the resistance value of the disconnection detection wire pattern WB. If a failure or the like is present, the failure or the like disconnects the disconnection detection pattern WB to increase the resistance value between the electrode pads a and b. Further, a large-scale wire TEG can be formed above memory cells over the whole area of the memory part MM similarly to the system LSI chip according to the embodiment 1 or 2, whereby the detection rate for abnormality is higher as compared with the case of forming the wire TEG in a small free space flush with the product region. In addition, the wire TEG function also as a dummy pattern and an electric shielding member.

Embodiment 4

A system LSI chip according to an embodiment 4, omitting a single electrode pad provided on a wire TEG, is substitutionally supplied with a power supply potential or a ground potential of a product region.

Figure 5:
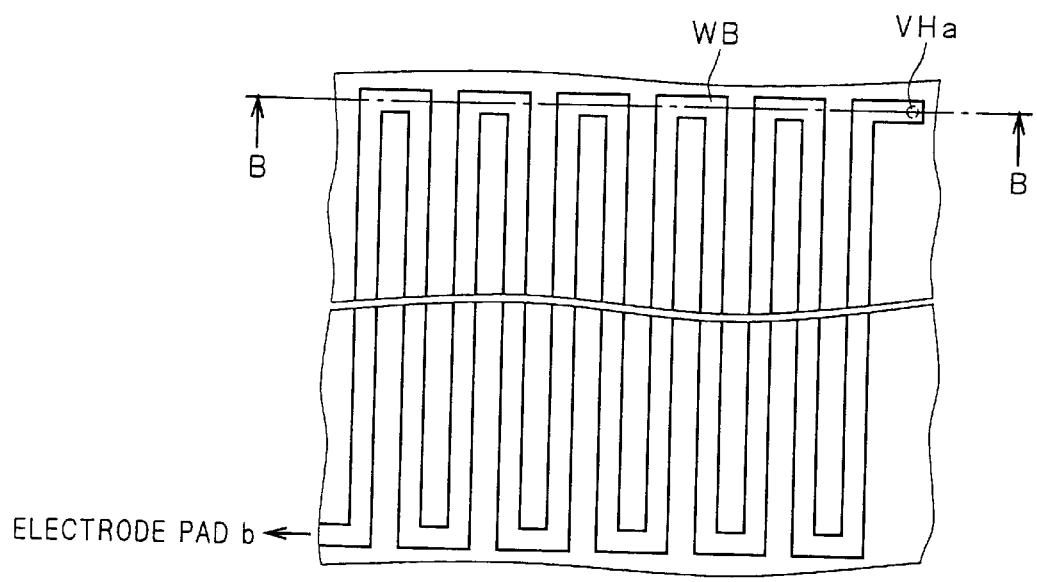
FIG. 5 illustrates part of a system LSI chip according to an embodiment 4 of the present invention.
Figure 6:
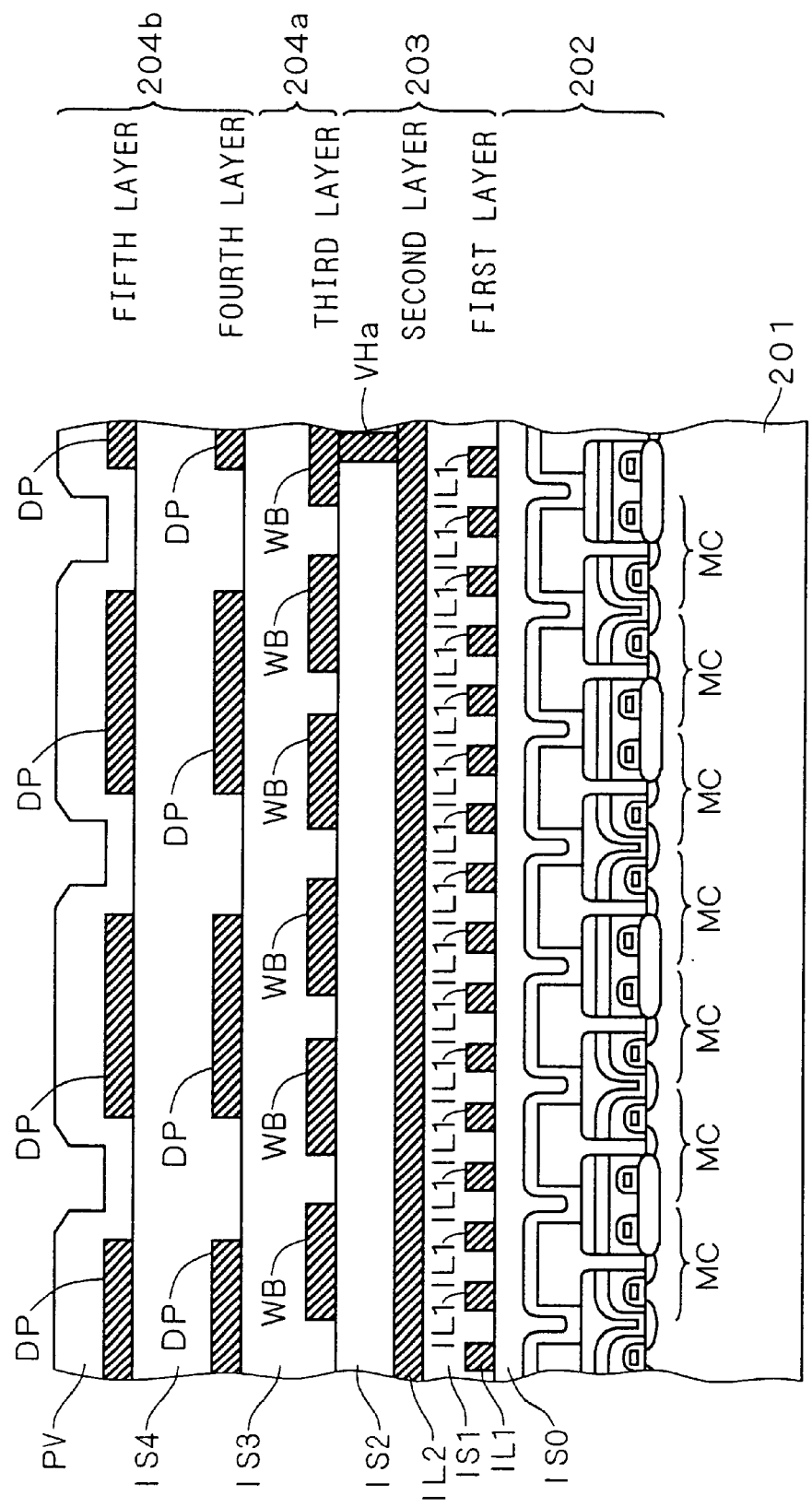
FIG. 6 is a sectional view of the system LSI chip according to the embodiment 4 of the present invention.

FIG. 5 shows the case of connecting a power supply/ground wire IL2 to an end of a TEG of a disconnection detection wire pattern WB through a via hole connection part VHa, for example, in place of providing an electrode pad a with reference to the system LSI chip according to the embodiment 3. FIG. 6 is a sectional view taken along the line B—B in FIG. 5. Similarly to the embodiment 1, a memory part MM formed with the disconnection detection wire pattern WB comprises an element layer 202 having a number of memory cells MC on a substrate 201 as well as a wire layer 203 having power supply/ground wires IL1 and IL2, a TEG and dummy pattern layer 204a having the disconnection detection wire pattern WB and a dummy pattern layer 204b having dummy patterns DP arranged above the element layer 202. Interlayer isolation films IS0, IS1, IS2, IS3 and IS4 are formed between the layers for isolating the layers from each other. A passivation film PV protecting the surfaces is formed on the uppermost dummy patterns DP. An end of the disconnection detection wire pattern WB is connected to an electrode pad b, and the other end thereof is connected with the power supply/ground wire IL2 through the via hole connection part VHa as described above.

In the system LSI chip according to this embodiment, a single electrode pad can be omitted as to a single wire TEG pattern, whereby the number of electrode pads requiring a wide area can be reduced and electrode pads for a product region can be widely provided. The wire TEG, which is supplied with the power supply potential or the ground potential of the product region, becomes a metal film having a fixed potential after workmanship evaluation to attain a more effective electric shielding function.

Also when connecting an end of the wire TEG to the power supply potential or the ground potential of the product region, the capacitance load of the TEG is merely added to the power supply/ground wires, and hence the wire TEG does not exert bad influence on the product region.

Embodiment 5

In a system LSI chip according to an embodiment 5 of the present invention, electrode pads connected with both ends of a wire TEG are provided in a layer having the wire TEG.

Figure 7:
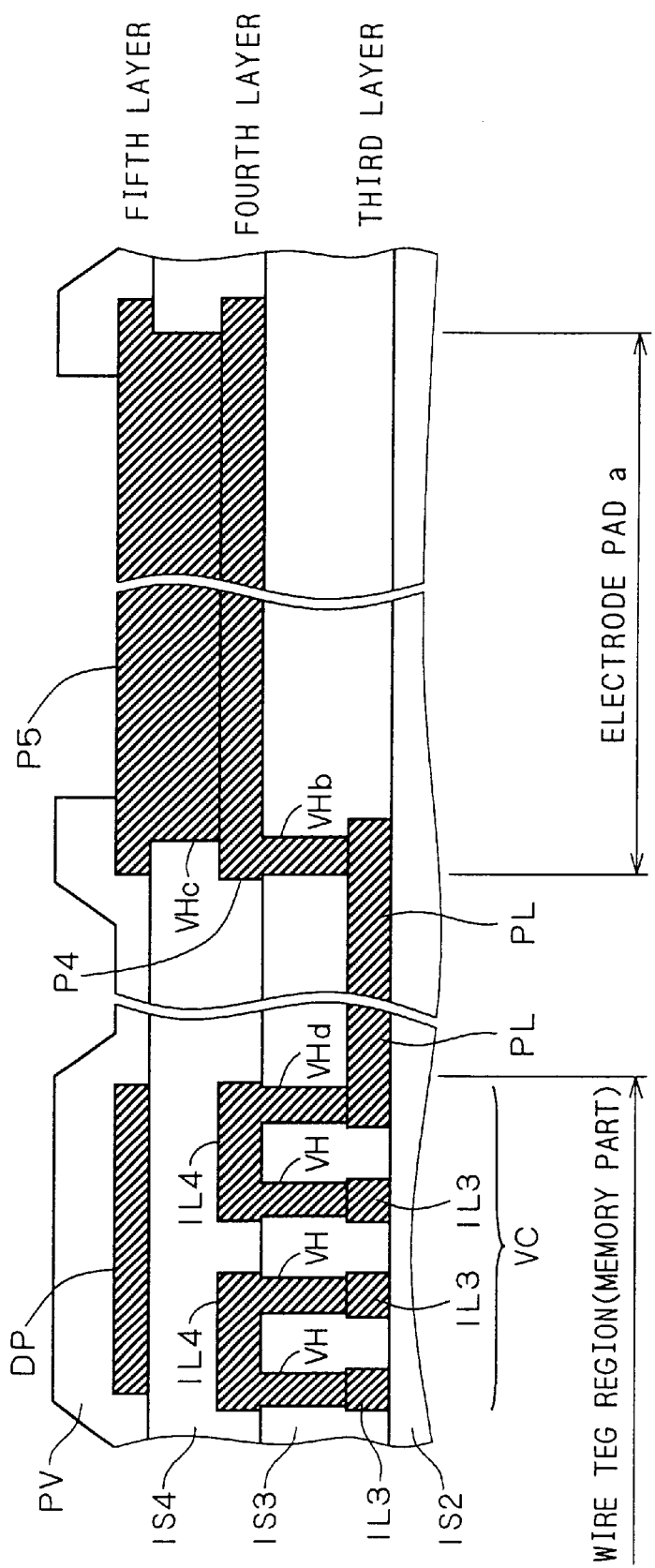
FIG. 7 is a sectional view of a system LSI chip according to an embodiment 5 of the present invention.

FIG. 7 shows the case of providing electrode pads a and b connected with both ends of a wire TEG of a via hole chain VC also in a fourth layer in addition to a fifth layer, which is the uppermost wire layer, with reference to the system LSI chip according to the embodiment 1. The left half of FIG. 7 shows the same portion as that of the third to fifth layers of the structure of the memory part MM shown in FIG. 2. However, not a wire IL3 but a wire PL connected with the electrode pad a is connected to a via hole connection part VHd located on the final end of the wire TEG of the via hole chain VC. The right half of FIG. 7 shows the structure of the electrode pad a. The wire PL is connected to an electrode pad P4 formed in the fourth layer through a via hole connection part VHb. The electrode pad P4 is connected to an electrode pad P5 formed in the fifth layer through a via hole connection part VHc.

Figure 8:
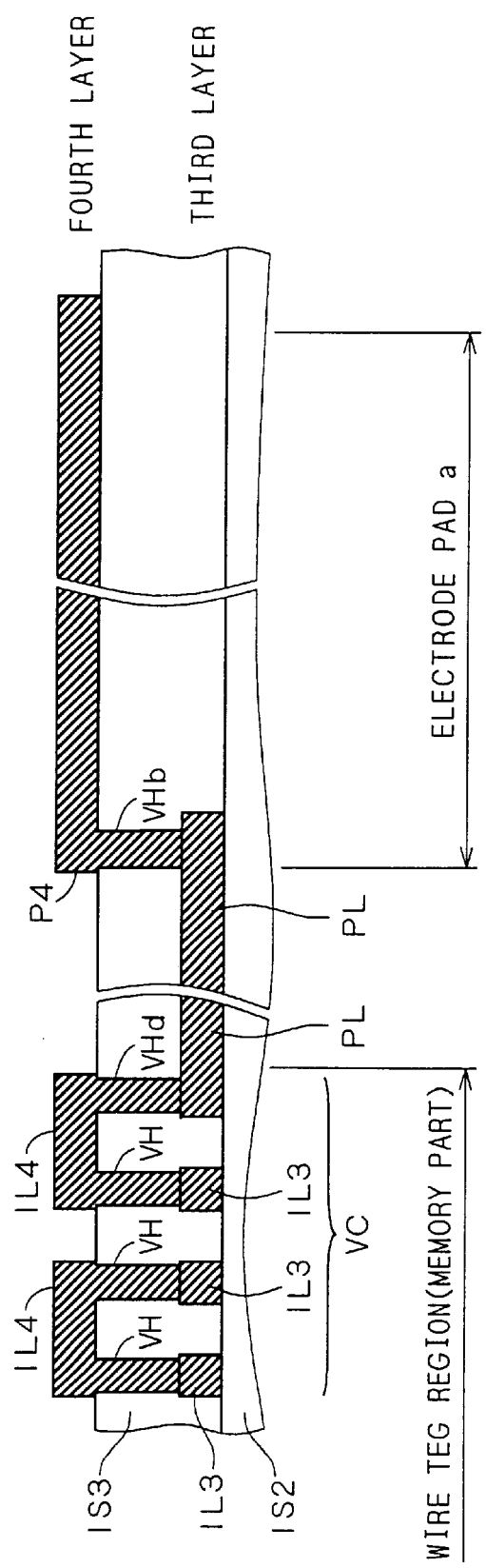
FIG. 8 illustrates a section of the system LSI chip in a stage preceding that in FIG. 7.
Figure 9:
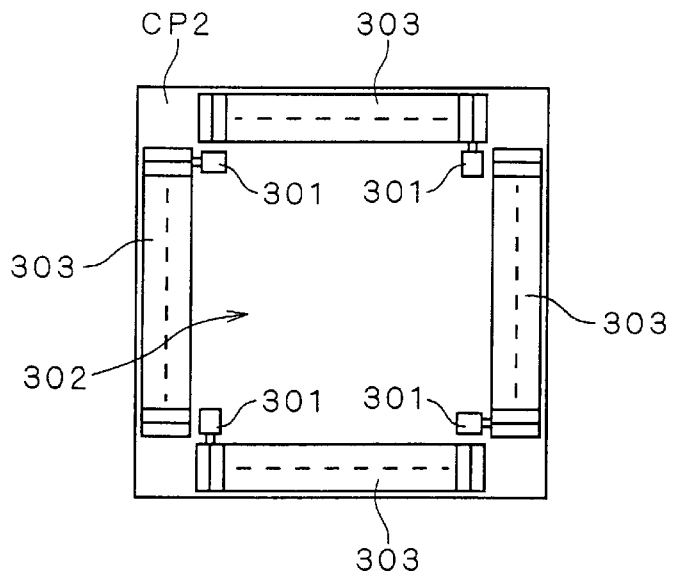
FIG. 9 illustrates a conventional semiconductor device.

Such a system LSI chip is formed as follows: The structure of a portion located closer to a substrate 101 than an interlayer isolation film IS3 is identical to that shown in FIG. 2, and hence the following description is made also with reference to FIG. 2. First, an element layer 102 is formed by forming memory cells MC and an interlayer isolation film IS0 in a memory part MM on the substrate 101. At this time, logic elements etc. are formed also in a logic part LG, similarly to the memory part MM. Power supply/ground wires IL1, an interlayer isolation film IS1, power supply/ground wires IL2 and an interlayer isolation film IS2 are formed in the memory part MM in this order. Thereafter a metal film is formed on the surface of the interlayer isolation film IS2 and patterned for forming the wires IL3 and PL. An interlayer isolation film IS3 is formed to cover the wires IL3 and PL. Via holes connected with the wires IL3 are formed in the interlayer isolation film IS3 through photolithography, then a metal film is formed on the surface of the interlayer isolation film IS3, and the via holes are filled up with the metal film for forming the via hole connection parts VH, VHb and VHd. The metal film is patterned for forming the wires IL4 and the electrode pad P4. FIG. 8 is a sectional view showing a structure obtained through the aforementioned steps. In formation of the power supply/ground wires IL1 and IL2, the wires IL3 and IL4 and the interlayer isolation films IS0 to IS3, wires and interlayer isolation films are formed also in the logic part LG through common steps, for simultaneously forming a multilayer wire structure.

In general, electrode pads of a wire TEG may be provided only in the uppermost wire layer in a multilayer wire structure so that a probe can come into contact with the same in a test after completion of the chip. If workmanship of the wire TEG can be evaluated immediately after formation of the wire TEG, however, abnormality of the wires can be found out in an early stage of the process. When formation of the electrode pad P4 is also completed in the stage of completion of the via hole chain VC with formation of the fourth layer wires IL4 on the surface of the interlayer isolation film IS3 as shown in FIG. 8, therefore, it is possible to evaluate the workmanship of the wires in an early stage without through subsequent processes for selecting a defective chip. Thus, it is possible to not perform a subsequent process on the defective chip having abnormality in its wire, in order to avoid waste. While the electrode pad P4 is formed in the fourth layer formed with the wires IL4 located in the wire TEG of the via hole chain VC over two vertical layers, the electrode pad may alternatively be formed on the uppermost layer of the wire TEG when the wire TEG more widely extends in the vertical direction.

When detecting a portion of deficiency or abnormality with an optical method after completion of the chip, upper layer wires (dummy patterns DP in FIG. 7) screen the wire TEG and hence the portion of deficiency or abnormality is hard to detect. If the electrode pad P4 is also formed when the via hole chain VC is completed as described above, the portion of deficiency or abnormality can be readily detected with the optical method with no upper layer wires serving as screens.

A chip recognized as normal in the stage of FIG. 8 may be formed with the interlayer isolation film IS4, the via hole connection part VHc, the electrode pad P5, the dummy patterns DP and the passivation film PV for completing the system LSI chip as shown in FIG. 7, so that an acceleration test after completion or the like can be performed.

In the system LSI chip according to this embodiment, the electrode pads of the wire TEG are formed in the same layer as that having the wire TEG, whereby workmanship of the wire TEG can be evaluated immediately after formation of the wire TEG. Thus, abnormality can be found out in an early stage of the process. Further, the portion of deficiency or abnormality can be detected through an optical method with no upper layer wire layers serving as screens for the wire TEG, whereby abnormality can be readily detected.

Others

While a single type of wire TEG is formed in the dummy pattern layer of the memory part MM in each of the aforementioned embodiments, a plurality of types of wire TEGs may be formed in a single system LSI chip, as a matter of course.

While the invention has been shown and described in detail, the foregoing description is in all aspects illustrative and not restrictive. It is therefore understood that numerous modifications and variations can be devised without departing from the scope of the invention.

What is claimed is:

1. A system LSI chip comprising:
   a substrate having a surface divided into at least a logic part and a memory part;
   a multilayer wire structure formed on said logic part of said substrate;
   an element layer, formed on said memory part of said substrate, having a memory cell;
   a first interlayer isolation film formed on said element layer; and
   a wire test structure formed on said first interlayer isolation film over the whole area of said memory part,
   wherein the wire test structure is a series of wire structures and includes at least a plurality of upper layer wires, a plurality of lower layer wires with a second interlayer isolation film formed thereon, and a plurality of via hole connection parts connecting the upper and lower layer wires to each other.

2. The system LSI chip according to claim 1, wherein said multilayer wire structure and said wire test structure are formed through a common step.

3. The system LSI chip according to claim 2, wherein a fixed potential is supplied to part of said wire test structure.

4. The system LSI chip according to claim 2, further comprising:
   an electrode pad, connected with said wire test structure, having a surface flush with a part of said wire test structure furthest from said substrate.

* * * * *